United States Patent
Lin et al.

(10) Patent No.: US 11,282,920 B2
(45) Date of Patent: Mar. 22, 2022

(54) SEMICONDUCTOR DEVICE WITH AIR GAP ON GATE STRUCTURE AND METHOD FOR FORMING THE SAME

(71) Applicant: Taiwan Semiconductor Manufacturing Co., Ltd., Hsinchu (TW)

(72) Inventors: Tien-Lu Lin, Hsinchu (TW); Che-Chen Wu, Hsinchu (TW); Chia-Lin Chuang, Taoyuan (TW); Yu-Ming Lin, Hsinchu (TW); Chih-Hao Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 157 days.

(21) Appl. No.: 16/572,192

(22) Filed: Sep. 16, 2019

(65) Prior Publication Data

US 2021/0083046 A1 Mar. 18, 2021

(51) Int. Cl.
*H01L 29/06* (2006.01)
*H01L 29/08* (2006.01)
(Continued)

(52) U.S. Cl.
CPC ........ *H01L 29/0649* (2013.01); *H01L 21/764* (2013.01); *H01L 21/76831* (2013.01);
(Continued)

(58) Field of Classification Search
CPC ............... H01L 29/0649; H01L 21/764; H01L 21/76831
See application file for complete search history.

(56) References Cited

U.S. PATENT DOCUMENTS 5,770,507 A * 6/1998 Chen ................... H01L 29/4933
257/E21.438
5,869,374 A * 2/1999 Wu ..................... H01L 29/4991
438/291

(Continued)

FOREIGN PATENT DOCUMENTS

CN 103681331 A * 3/2014 ....... H01L 29/66545
WO WO-2019080850 A1 * 5/2019 ....... H01L 27/10823

OTHER PUBLICATIONS

Machine translation, Mieno, Chinese Pat. Pub. No. CN 103681331A, translation date: Apr. 19, 2021, Espacenet, all pages. (Year: 2021).*

*Primary Examiner* — Victoria K. Hall
(74) *Attorney, Agent, or Firm* — Birch, Stewart, Kolasch & Birch, LLP

(57) ABSTRACT

A semiconductor device structure is provided. The semiconductor device structure includes a source/drain contact structure formed over a semiconductor substrate, and a first gate stack formed over the semiconductor substrate and adjacent to the source/drain contact structure. The semiconductor device structure also includes an insulating cap structure formed over and separated from an upper surface of the first gate stack. In addition, the semiconductor device structure includes first gate spacers formed over opposing sidewalls of the first gate stack to separate the first gate stack from the source/drain contact structure. The first gate spacers extend over opposing sidewalls of the insulating cap structure, so as to form an air gap surrounded by the first gate spacers, the first gate stack, and the insulating cap structure.

20 Claims, 15 Drawing Sheets

(51) Int. Cl.
*H01L 29/78* (2006.01)
*H01L 29/66* (2006.01)
*H01L 21/768* (2006.01)
*H01L 21/764* (2006.01)

(52) U.S. Cl.
CPC .... *H01L 21/76897* (2013.01); *H01L 29/0847* (2013.01); *H01L 29/66795* (2013.01); *H01L 29/785* (2013.01); *H01L 29/665* (2013.01); *H01L 29/66545* (2013.01)

(56) References Cited

U.S. PATENT DOCUMENTS

| | | | |
|---|---|---|---|
| 6,127,712 A * | 10/2000 | Wu | H01L 21/76895 257/386 |
| 6,548,362 B1 * | 4/2003 | Wu | H01L 21/76895 257/E21.149 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,263,392 B1 * | 2/2016 | Lin | H01L 29/785 |
| 9,306,022 B1 * | 4/2016 | Oh | H01L 21/764 |
| 9,362,355 B1 * | 6/2016 | Cheng | H01L 29/78696 |
| 9,520,482 B1 | 12/2016 | Chang et al. | |
| 9,576,814 B2 | 2/2017 | Wu et al. | |
| 9,608,065 B1 * | 3/2017 | Bergendahl | H01L 27/0886 |
| 9,721,897 B1 * | 8/2017 | Cheng | H01L 23/535 |
| 9,768,118 B1 * | 9/2017 | Li | H01L 23/5283 |
| 9,853,031 B1 * | 12/2017 | Cho | H01L 29/4236 |
| 9,929,246 B1 * | 3/2018 | Cheng | H01L 29/435 |
| 10,026,824 B1 * | 7/2018 | Chanemougame | H01L 29/785 |
| 10,128,334 B1 * | 11/2018 | Bourjot | H01L 29/72 |
| 10,157,778 B2 * | 12/2018 | Tsai | H01L 23/535 |
| 10,170,573 B1 * | 1/2019 | Chiang | H01L 29/408 |
| 2013/0095629 A1 * | 4/2013 | Ando | H01L 29/785 438/299 |
| 2014/0042516 A1 * | 2/2014 | Kim | H01L 21/764 257/315 |
| 2015/0194333 A1 * | 7/2015 | You | H01L 21/76849 438/619 |
| 2015/0243544 A1 * | 8/2015 | Alptekin | H01L 29/6653 438/586 |
| 2016/0111515 A1 * | 4/2016 | Besser | H01L 29/6653 257/401 |
| 2016/0141240 A1 * | 5/2016 | Saka | H01L 23/4824 257/401 |
| 2016/0307999 A1 * | 10/2016 | Kim | H01L 29/0653 |
| 2017/0148662 A1 * | 5/2017 | Ok | H01L 29/4975 |
| 2017/0148874 A1 * | 5/2017 | Ok | H01L 21/31053 |
| 2017/0162650 A1 * | 6/2017 | Cheng | H01L 29/66795 |
| 2017/0317212 A1 * | 11/2017 | Kim | H01L 29/785 |
| 2018/0033863 A1 * | 2/2018 | Xie | H01L 29/0653 |
| 2018/0047642 A1 * | 2/2018 | Thees | H01L 21/2652 |
| 2018/0069092 A1 * | 3/2018 | Samavedan | H01L 29/785 |
| 2018/0130899 A1 * | 5/2018 | Zhang | H01L 29/7851 |
| 2018/0138279 A1 * | 5/2018 | Xie | H01L 29/4991 |
| 2018/0366553 A1 * | 12/2018 | Zang | H01L 29/7851 |
| 2019/0181223 A1 * | 6/2019 | Tang | H01L 21/76897 |
| 2019/0259831 A1 * | 8/2019 | Ok | H01L 21/3065 |
| 2019/0296123 A1 * | 9/2019 | Lee | H01L 21/02167 |
| 2019/0312123 A1 * | 10/2019 | Cheng | H01L 29/4966 |
| 2019/0334009 A1 * | 10/2019 | Cheng | H01L 29/66795 |
| 2019/0334011 A1 * | 10/2019 | Cheng | H01L 29/66553 |
| 2019/0393335 A1 * | 12/2019 | Economikos | H01L 29/6681 |
| 2020/0043796 A1 * | 2/2020 | Yeong | H01L 21/76895 |
| 2020/0075417 A1 * | 3/2020 | Lee | H01L 21/823468 |
| 2020/0075720 A1 * | 3/2020 | Cheng | H01L 21/02603 |
| 2020/0105909 A1 * | 4/2020 | Wu | H01L 29/66545 |
| 2020/0127109 A1 * | 4/2020 | Wang | H01L 29/785 |
| 2020/0161439 A1 * | 5/2020 | You | H01L 21/764 |
| 2020/0203351 A1 * | 6/2020 | Chae | H01L 27/10876 |
| 2020/0243643 A1 * | 7/2020 | Yu | H01L 29/66545 |
| 2020/0343359 A1 * | 10/2020 | Liaw | H01L 29/4991 |
| 2020/0411660 A1 * | 12/2020 | Mannebach | H01L 21/6835 |
| 2021/0098598 A1 * | 4/2021 | Yang | H01L 29/6653 |

\* cited by examiner

SEMICONDUCTOR DEVICE WITH AIR GAP ON GATE STRUCTURE AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET).

FinFETs are fabricated with a thin vertical "fin" (or fin structure) extending from a substrate. The advantages of a FinFET include a reduction of the short channel effect and a higher current flow.

Although existing FinFET manufacturing processes have generally been adequate for their intended purposes, they have not been entirely satisfactory in all respects, especially as device scaling-down continues. For example, it is a challenge to make a semiconductor device structure with reduced parasitic capacitance and reliable gate structures at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
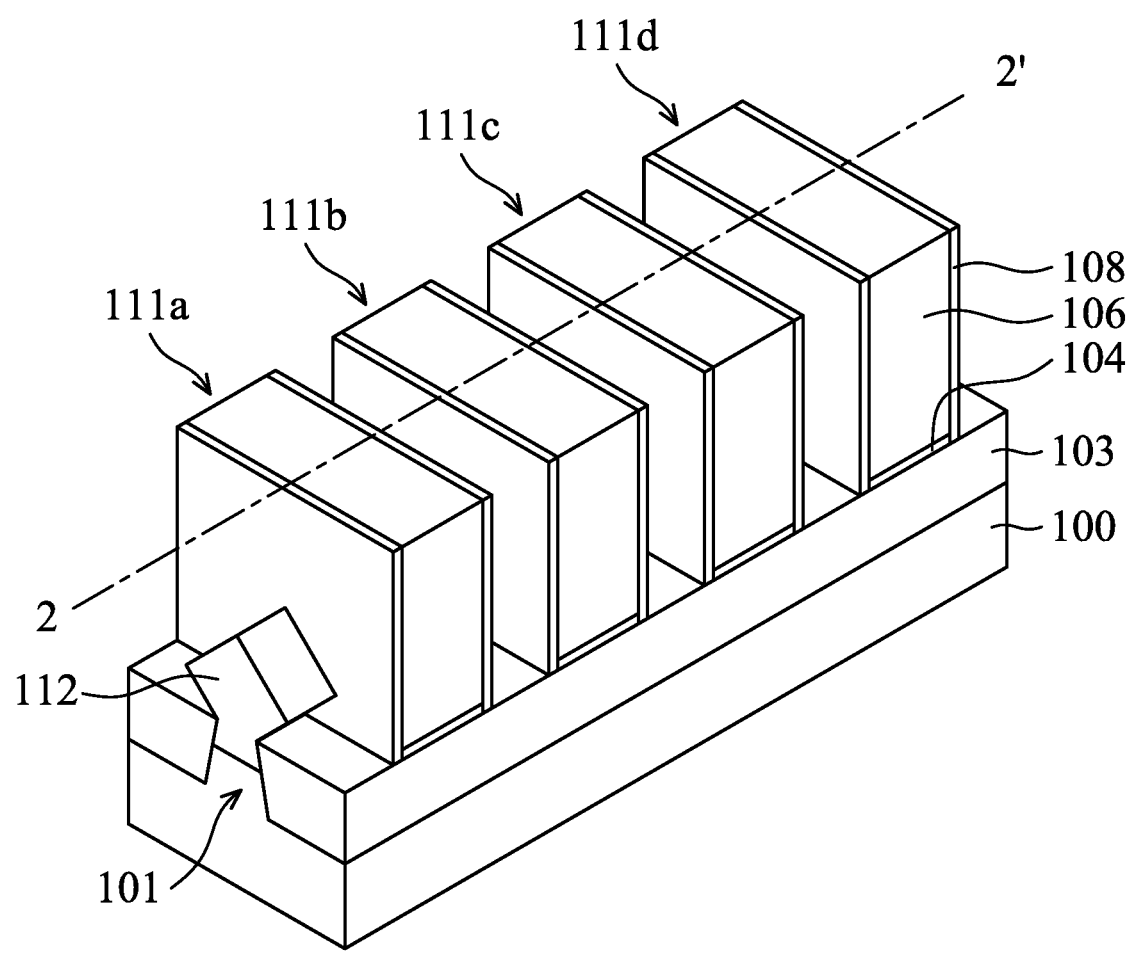
FIGS. 1A to 1D illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures may include a gate stack and a source/drain contact structure over a semiconductor substrate and adjacent to each other. An insulating cap structure is formed over the gate stack, and the insulating cap structure and the gate stack are separated from each other by an air gap. Gate spacers extend over the opposing sidewalls of the gate stack and the opposing sidewalls of the insulating cap, so that the air gap is surrounded by the gate spacers, the gate stack, and the insulating cap structure. The formation of the air gap includes forming a sacrificial layer over the gate stack. Afterwards, the sacrificial layer is covered with an insulating cap structure. The sacrificial layer is then removed, so as to form the air gap between the insulating cap structure and the gate stack. The air gap has a lower dielectric constant (k) than the other dielectric materials, so that the parasitic capacitance between the source/drain contact structure and the gate stack and between the interconnect structure and the gate stack can be reduced. Moreover, the insulating cap structure can be formed of a low-k material, so that the parasitic capacitance can be lowered further. As a result, the device performance can be effectively increased.

Figure 1B:
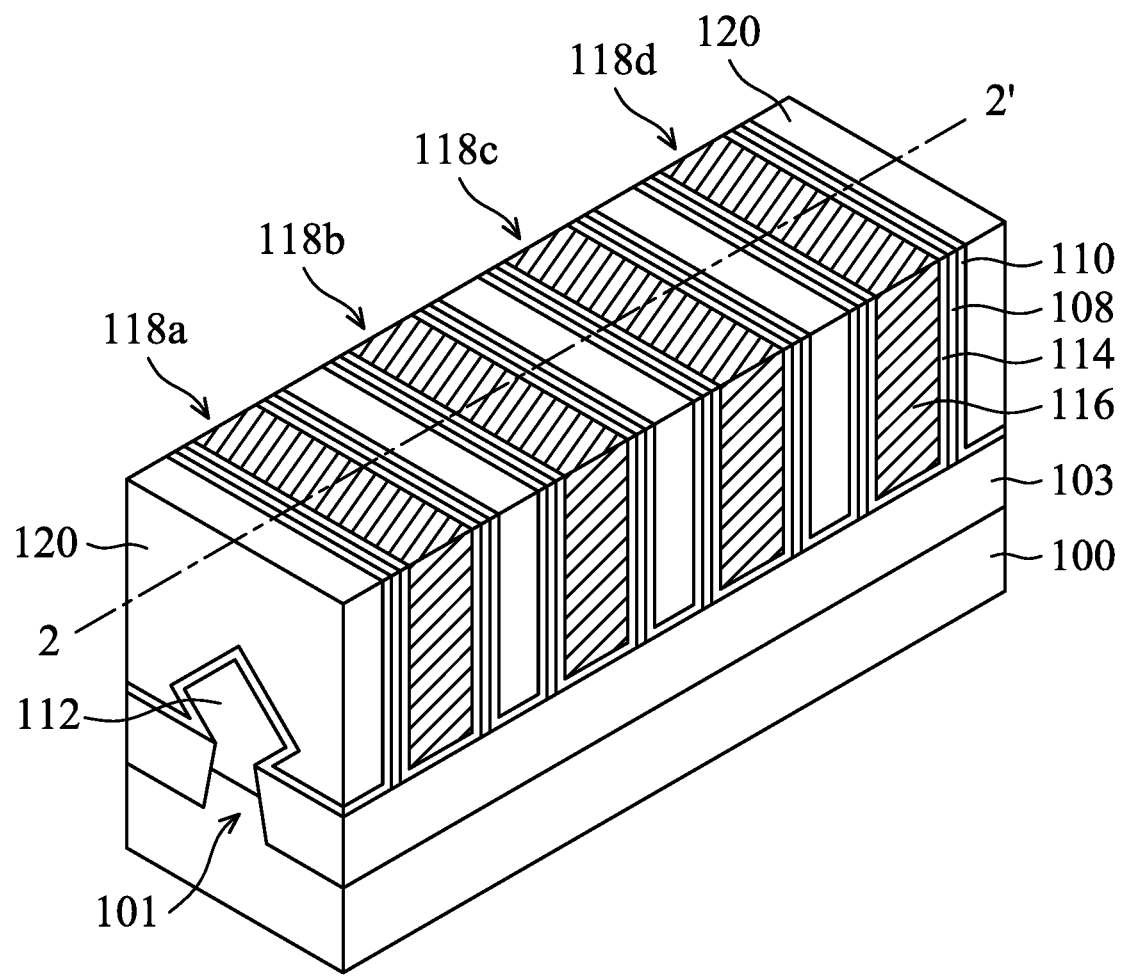
Figure 1C:
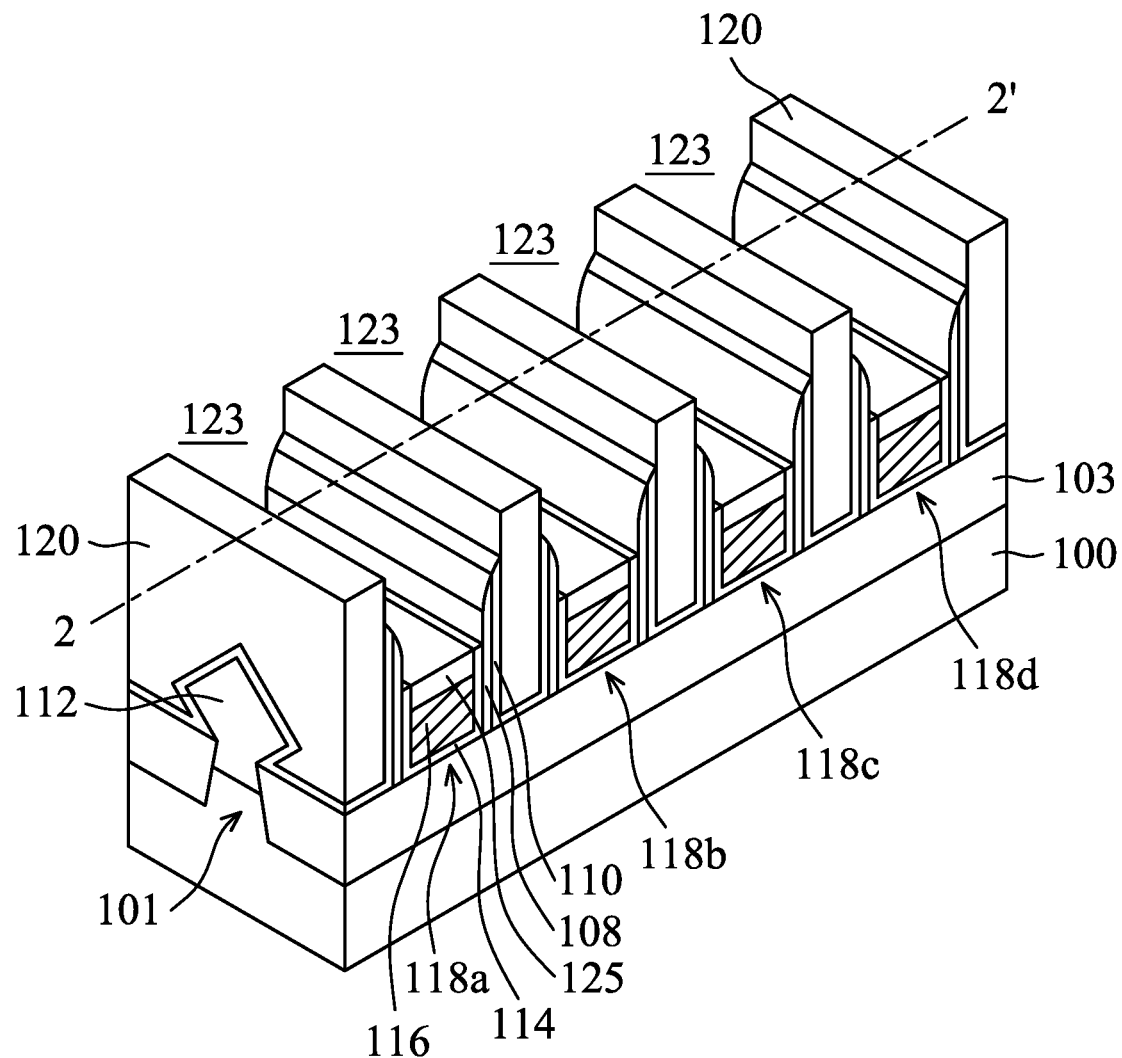
Figure 1D:
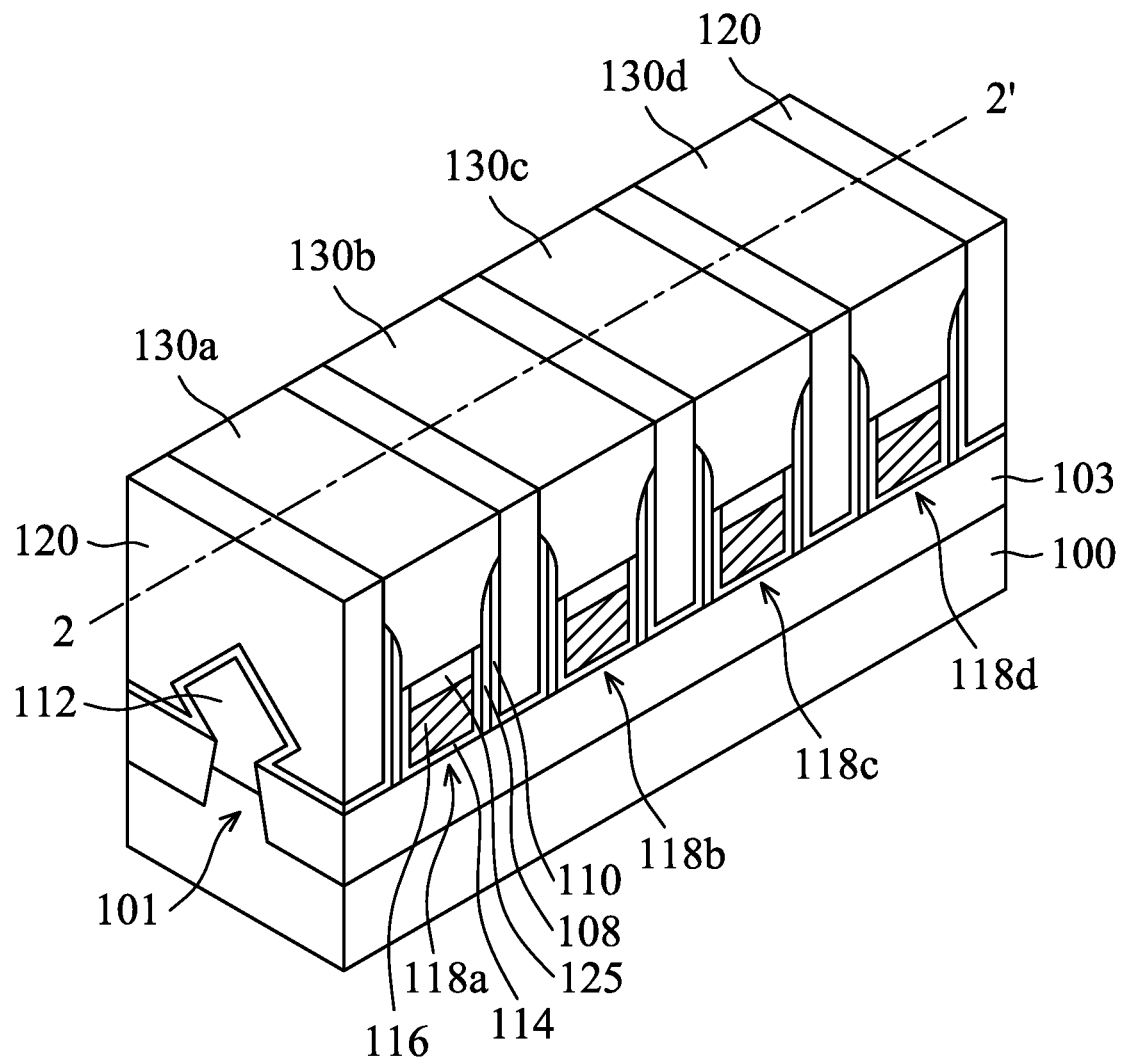
Figure 2A:
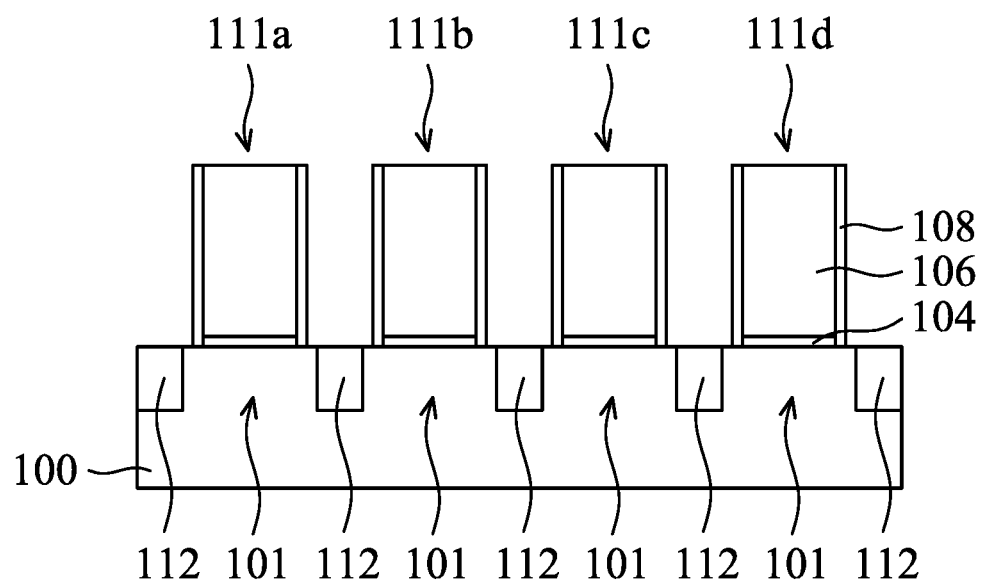
FIGS. 2A to 2R illustrate cross-sectional representations of various stages of manufacturing a semiconductor device structure in accordance with some embodiments.
Figure 2B:
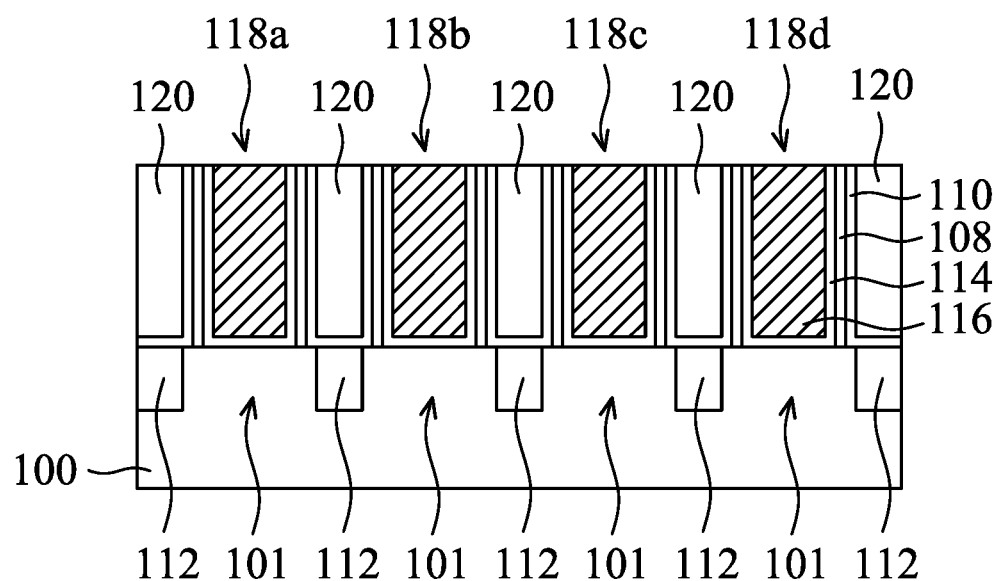
Figure 2C:
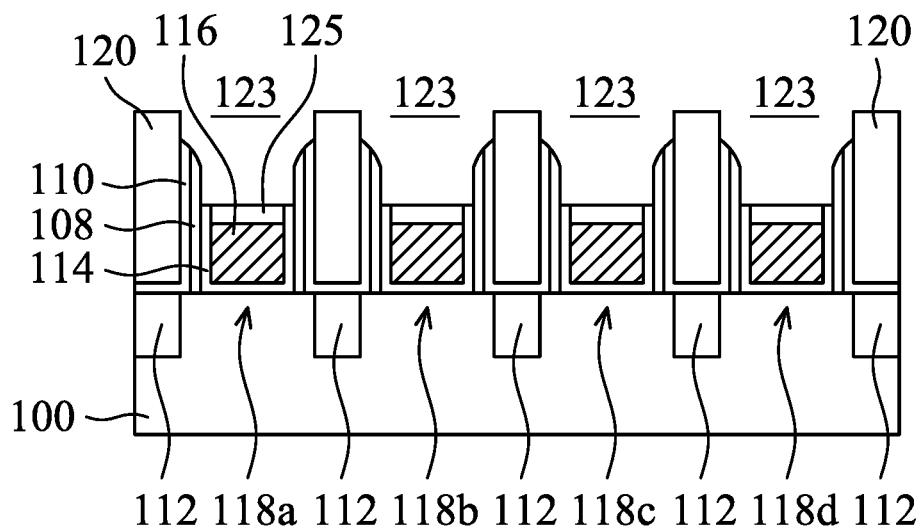
Figure 2D:
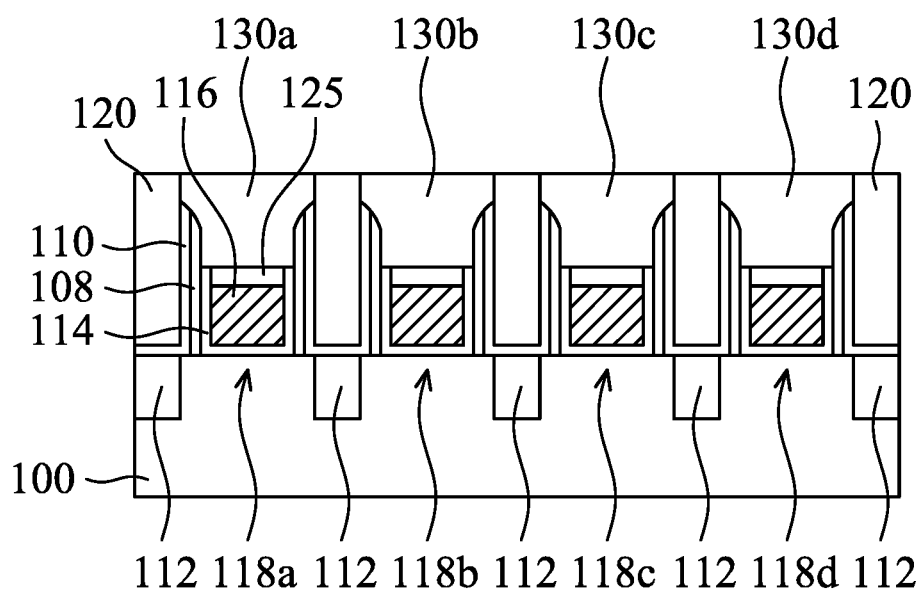
Figure 2E:
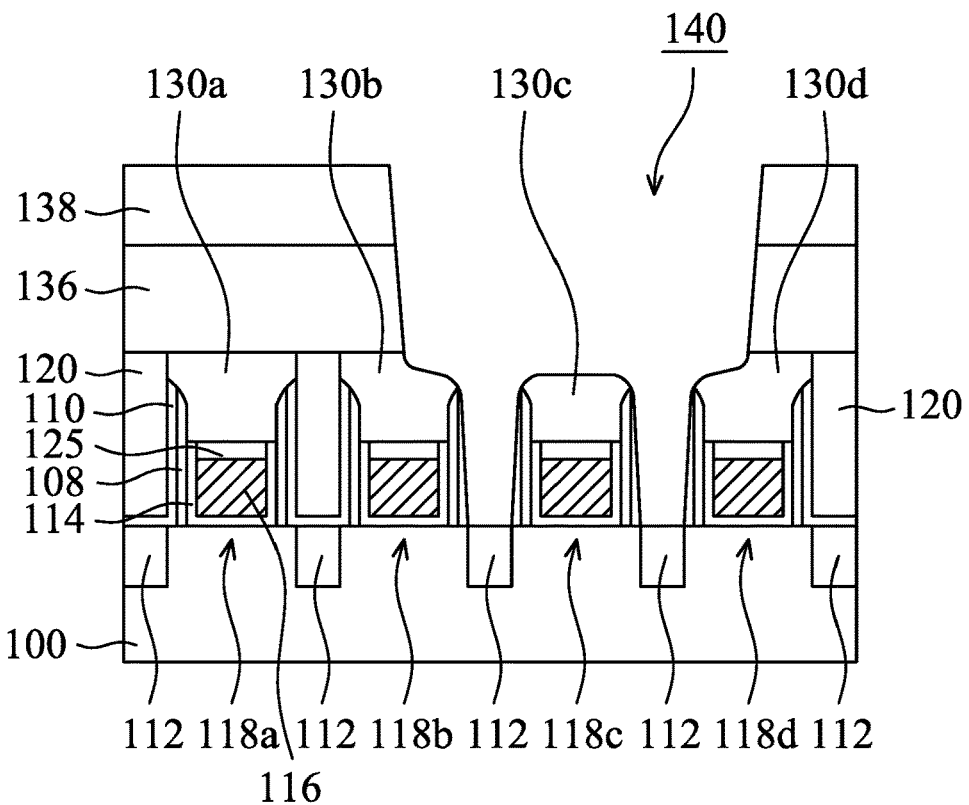
Figure 2F:
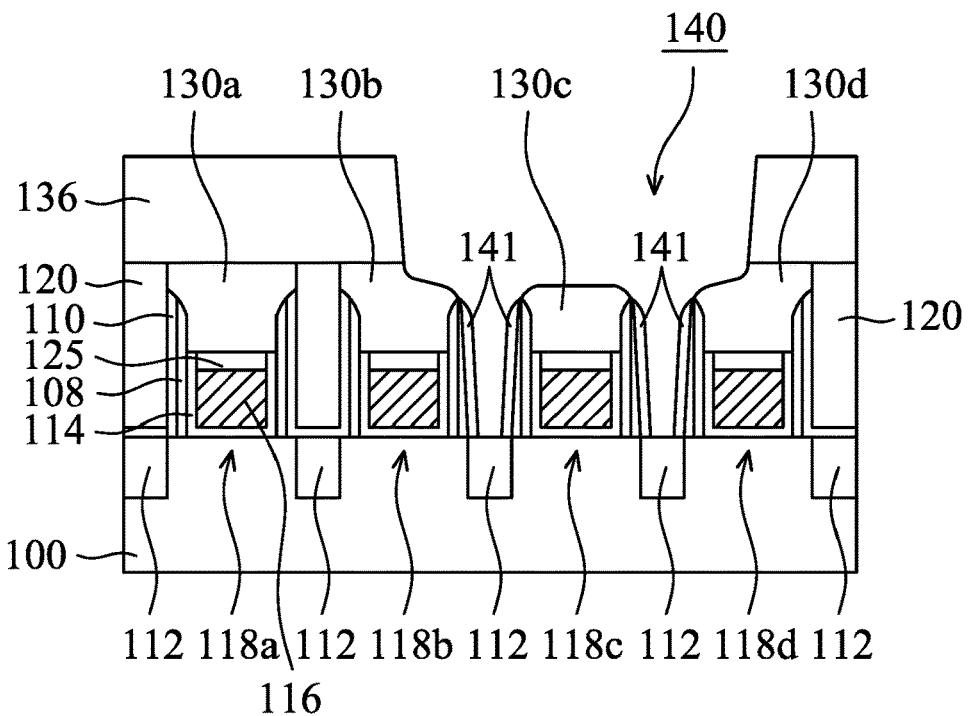
Figure 2G:
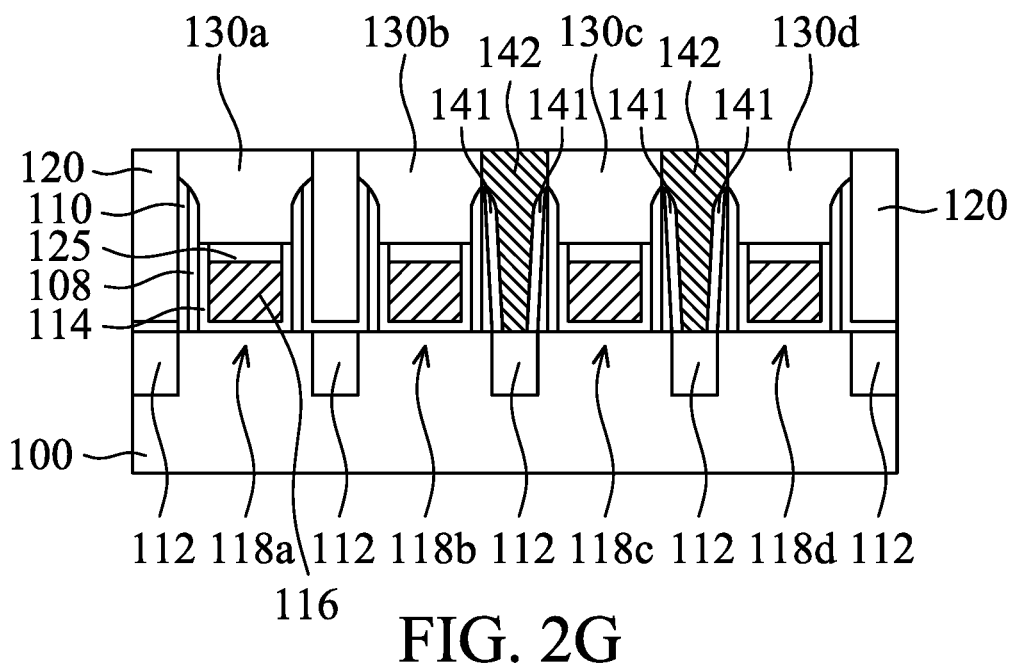
Figure 2H:
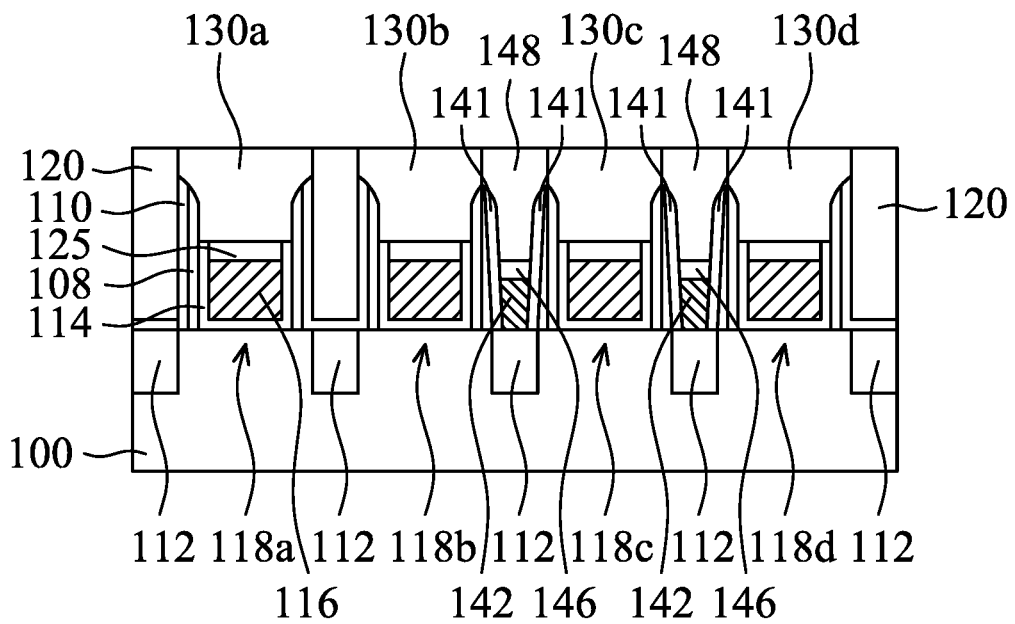
Figure 2I:
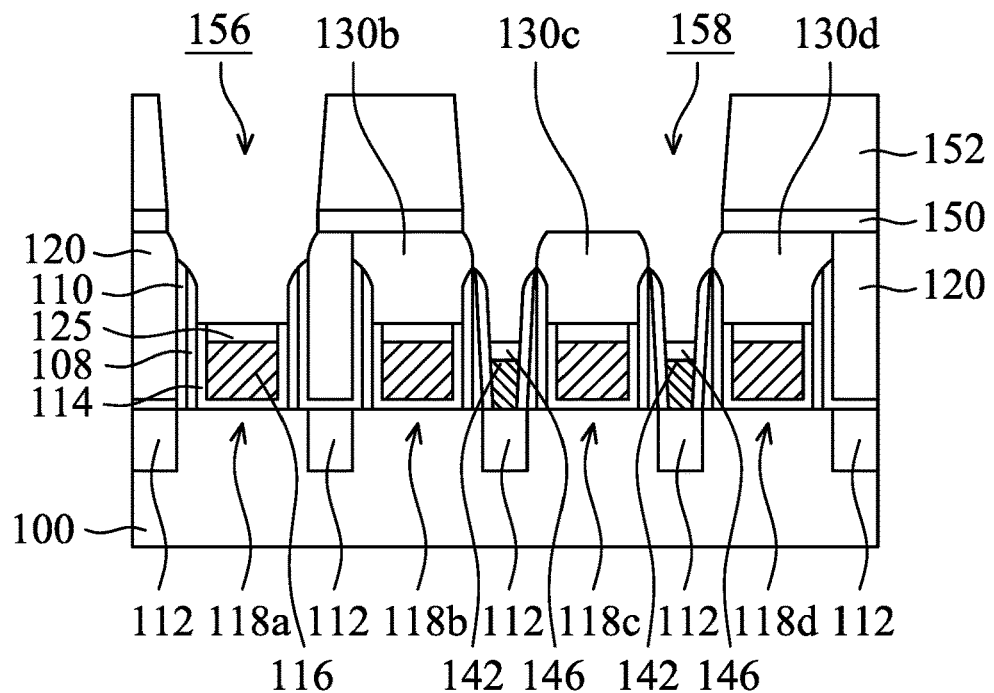
Figure 2J:
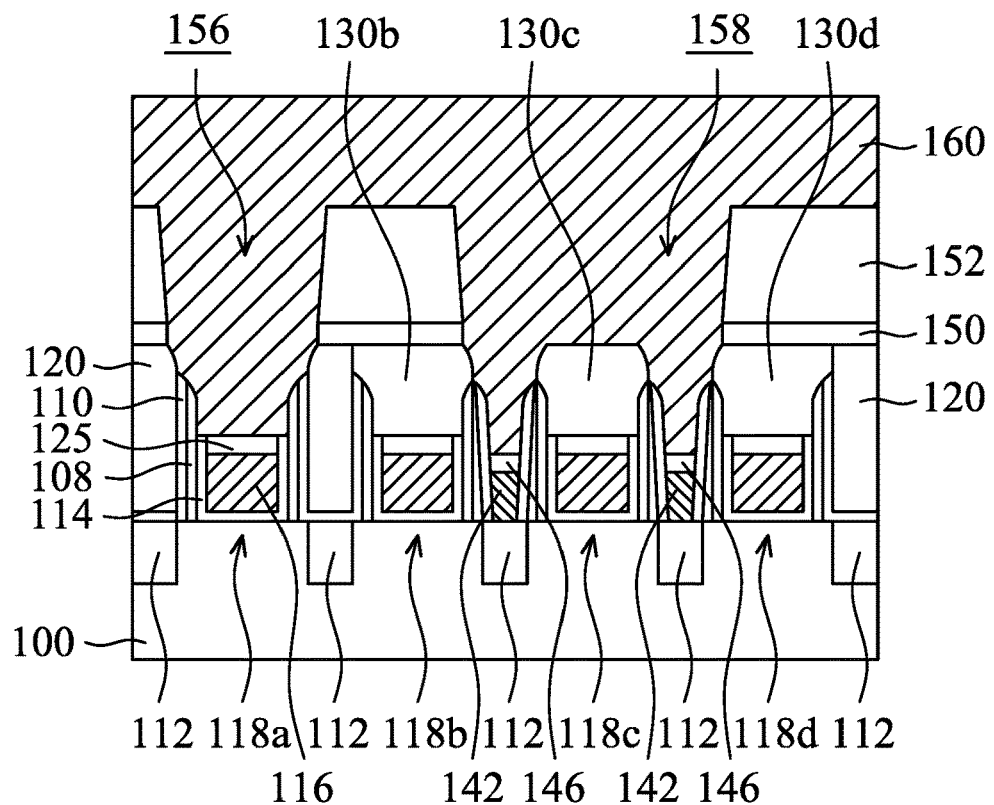
Figure 2K:
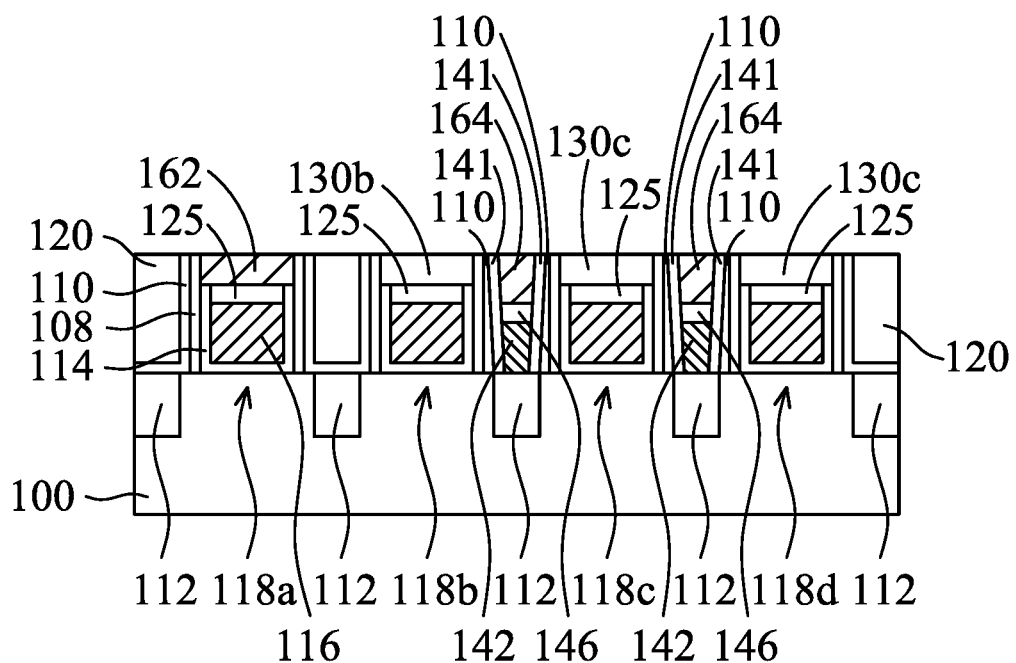
Figure 2L:
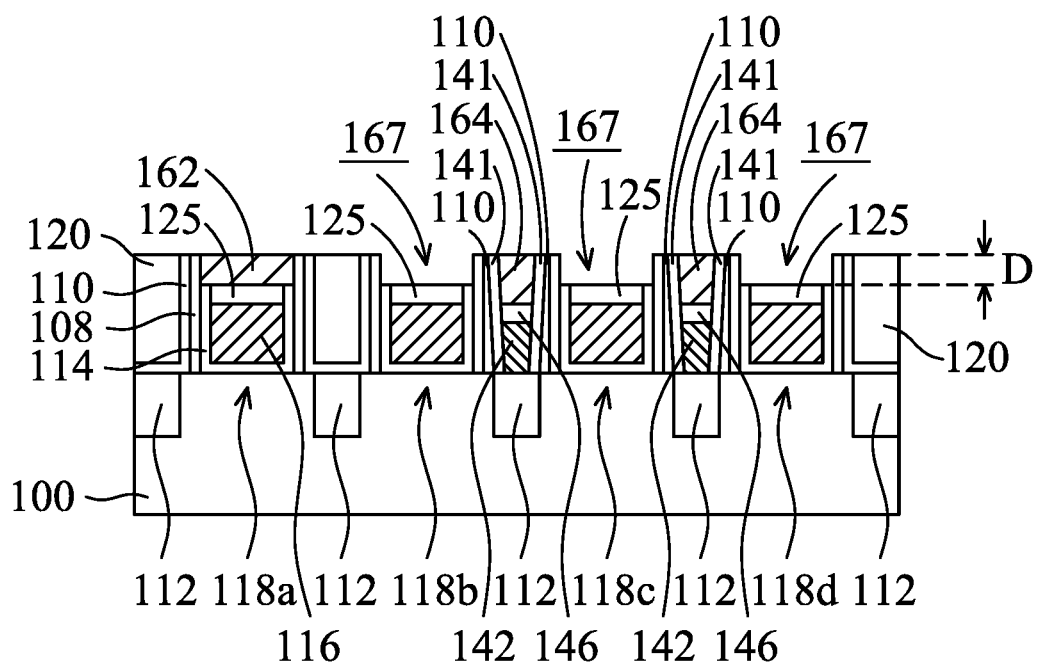
Figure 2M:
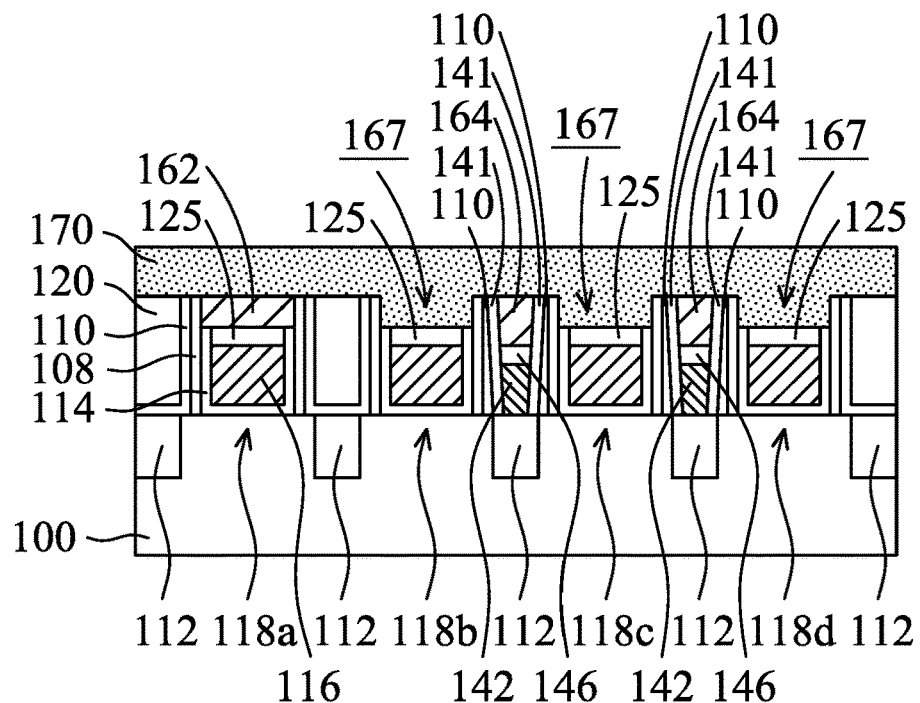
Figure 2N:
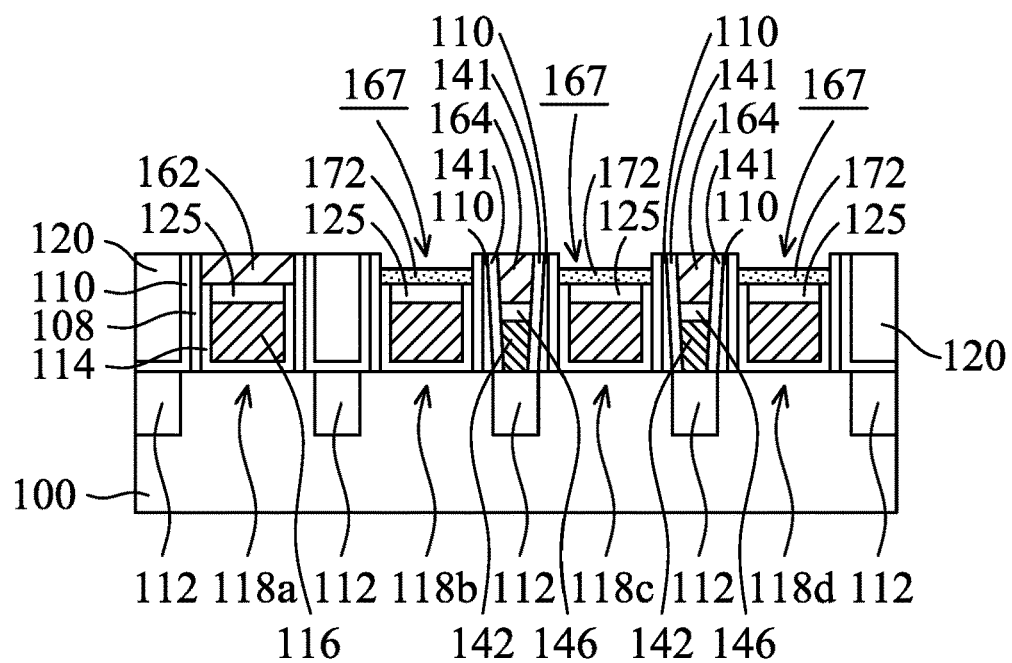
Figure 2O:
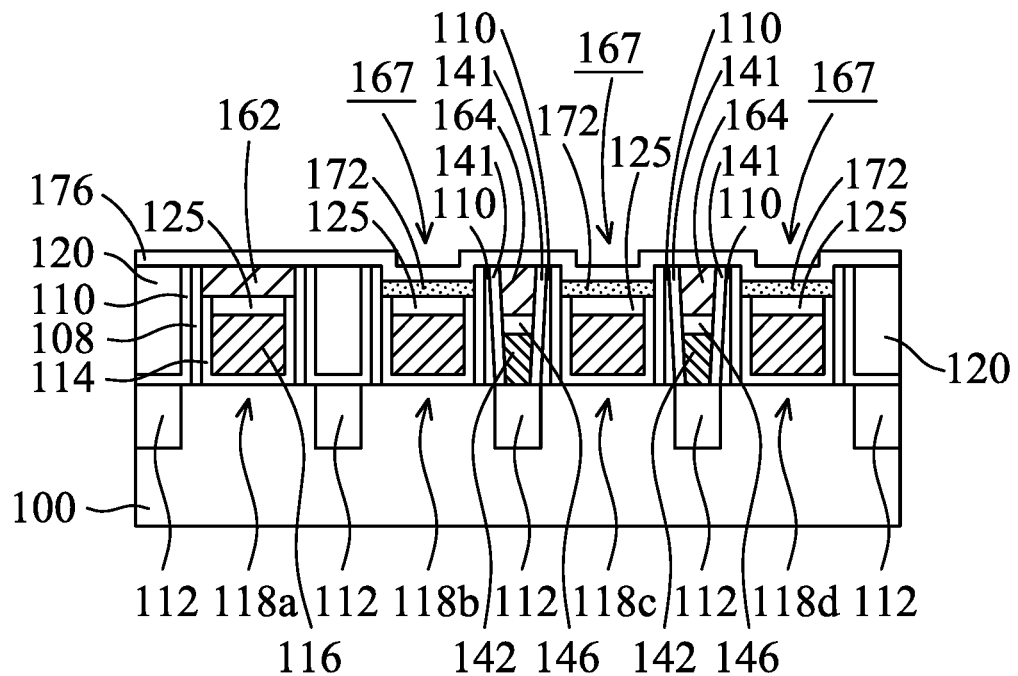
Figure 2P:
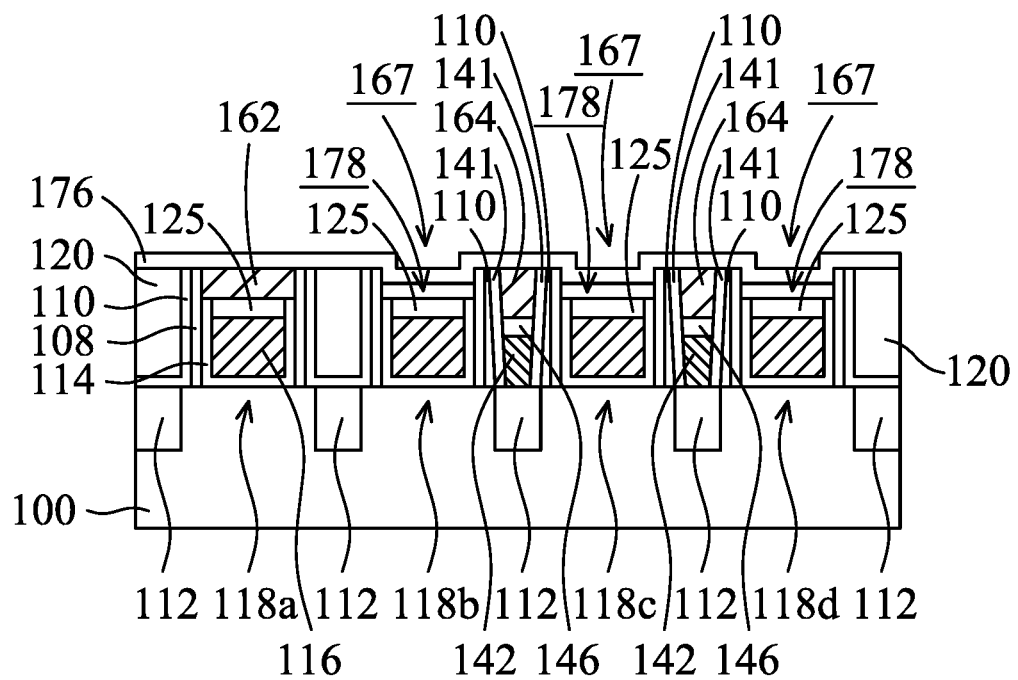
Figure 2Q:
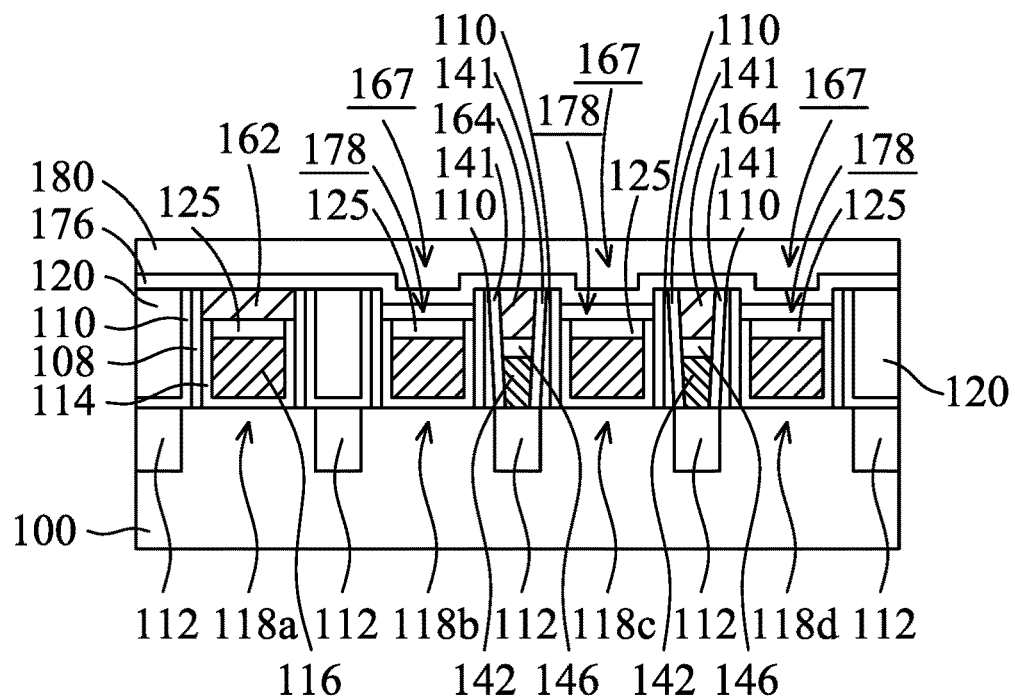
Figure 2R:
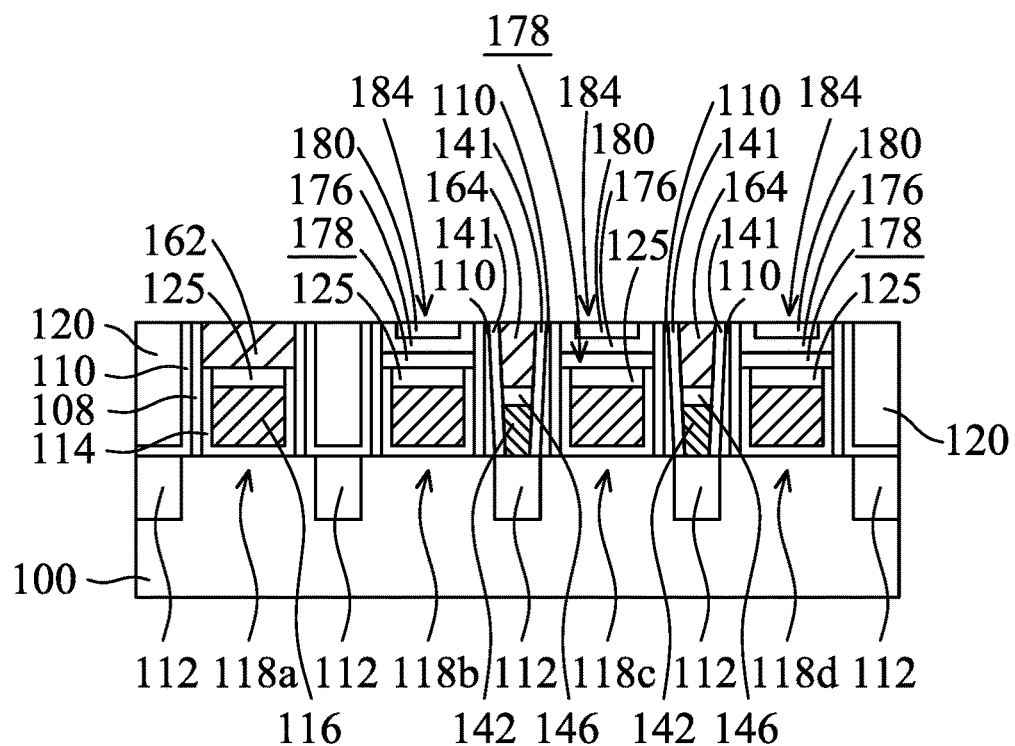

FIGS. 1A to 1D illustrate perspective views of various stages of manufacturing a semiconductor device structure and FIGS. 2A to 2R illustrate cross-sectional representations of various stages of manufacturing a semiconductor device structure in accordance with some embodiments. In addition, FIGS. 2A to 2D illustrate the cross-sectional representations of the semiconductor device structure shown along line 2-2' in FIGS. 1A to 1D in accordance with some embodiments. In some embodiments, the semiconductor device structure is implemented as a fin field effect transistor (FinFET) structure.

A substrate 100 is provided, as shown in FIGS. 1A and 2A in accordance with some embodiments. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. In some embodiments, the substrate 100 is a wafer, such as a silicon wafer.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 has a PMOS region for P-type FinFETs formed thereon and/or an NMOS region for N-type FinFETs formed thereon. In some embodiments, the PMOS region of the substrate 100 includes Si, SiGe, SiGeB, or an III-V group semiconductor material (such as InSb, GaSb, or InGaSb). The NMOS region of the substrate 100 includes Si, SiP, SiC, SiPC, or an III-V group semiconductor material (such as InP, GaAs, AlAs, InAs, InAlAs, or InGaAs).

Afterwards, a fin structure 101 and an isolation structure 103 formed over the substrate 100 is provided, as shown in FIG. 1A in accordance with some embodiments. In some embodiments, the substrate 100 is patterned to form at least one fin structure 101. The fin structure 101 may have slope sidewalls and extend from the patterned substrate 100.

In some embodiments, the isolation structure 103 is a shallow trench isolation (STI) structure, and the fin structure 101 is surrounded by and protrudes above the isolation structure 103.

The isolation structure 103 may be formed by depositing an insulating layer (not shown) over the substrate 100 and recessing the insulating layer. The recessed insulating layer for the formation of the isolation structure 103 may be made of silicon oxide, silicon nitride, silicon oxynitride, fluorosilicate glass (FSG), low-K dielectric materials, and/or another suitable dielectric material and may be deposited by a flowable CVD (FCVD) process, a chemical vapor deposition (CVD) process, an atomic layer deposition (ALD) process, or another applicable process.

Afterwards, dummy gate structures 111a, 111b, 111c, and 111d are formed across the fin structure 101 over the substrate 100 and cover the isolation structure 103, in accordance with some embodiments. Each of the dummy gate structures 111a, 111b, 111c, and 111d may include a dummy gate dielectric layer 104 and a dummy gate electrode layer 106 formed over the dummy gate dielectric layer 104. The dummy gate dielectric layer 104 may be made of silicon oxide and the dummy gate electrode layer 106 may be made of polysilicon.

Gate spacers 108 are formed on the opposing sides (e.g., opposing sidewalls) of the dummy gate structures 111a, 111b, 111c, and 111d after the formation of the dummy gate structures 111a, 111b, 111c, and 111d, in accordance with some embodiments. Each of the spacer layers 108 adjacent to the corresponding dummy gate structure, as shown in FIGS. 1A and 2A in accordance with some embodiments.

The spacer layer 108 may be used for protecting dummy gate structures 111a, 111b, 111c, and 111d from damage or loss during subsequent processing. The spacer layers 108 are made of silicon nitride, silicon oxide, silicon oxynitride, silicon carbide, or another applicable dielectric material.

After formation of the spacer layers 108, source/drain features 112 are formed in the fin structure 101 adjacent to and exposed from the dummy gate structures 111a, 111b, 111c, and 111d, as shown in FIGS. 1A and 2A in accordance with some embodiments. In some embodiments, the source/drain features 112 is formed by recessing the fin structure 101 exposed from the dummy gate structures 111a, 111b, 111c, and 111d and growing semiconductor materials in the formed recesses in the fin structure 101 by performing epitaxial (epi) growth processes.

In some embodiments, the semiconductor device structure is an NMOS device, and the source/drain features 112 include Si, SiP, SiC, SiPC, or an III-V group semiconductor material (such as InP, GaAs, AlAs, InAs, InAlAs, or InGaAs), or the like. In some embodiments, the semiconductor device structure is a PMOS device, and the source/drain features 112 include Si, SiGe, SiGeB, or an III-V group semiconductor material (such as InSb, GaSb, or InGaSb), or the like. In some embodiments, the source/drain features 112 protrude above the isolation structure 103.

A contact etch stop layer 110 and an insulating layer 120 are successively formed over the isolation structure 103 after the source/drain features 112 are formed, as shown in FIGS. 1B and 2B in accordance with some embodiments. The contact stop layer 110 conformally covers the gate spacers 108 over the opposing sidewalls of the dummy gate structures 111a, 111b, 111c, and 111d, the source/drain features 112, and the isolation structure 103. The contact etch stop layer 110 may be used for forming contact holes (not shown) in the source/drain features 112 and for protecting subsequent active gate structures from damage or loss during subsequent processing. In some embodiments, the contact etch stop layer 110 is made of a material that is different from that of the spacer layer 108, and includes silicon nitride, silicon oxide, silicon carbide, silicon oxynitride, or another applicable material.

After the formation of the contact etch stop layer 110, the insulating layer 120 covers the contact etch stop layer 110 and the structure shown in FIGS. 1A and 2A. Afterwards, a polishing process is performed to remove the excess insulating layer 120 and the contact etch stop layer 110 above the dummy gate structures 111a, 111b, 111c, and 111d, in accordance with some embodiments. In some embodiments, such a polishing process is performed on the insulating layer 120 until the insulating layer 120 is planarized and the dummy gate structures 111a, 111b, 111c, and 111d are exposed. In some embodiments, the polishing process includes a chemical mechanical polishing (CMP) process.

The remaining insulating layer 120 (which serves as an interlayer dielectric (ILD) layer) may be made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 120 may be deposited by any suitable method, such as a chemical vapor deposition (CVD) process, a plasma enhanced CVD (PECVD) process, flowable CVD (FCVD) process, the like, or a combination thereof. The insulating layer 120 may be a single layer or include multiple dielectric layers with the same or different dielectric materials.

Afterwards, the dummy gate structures 111a, 111b, 111c, and 111d are removed and replaced by gate structures 118a, 118b, 118c, and 118d, as shown in FIGS. 1B and 2B in accordance with some embodiments. In some embodiments, each of the gate structures 118a, 118b, 118c, and 118d at least includes a gate dielectric layer 114, a gate electrode layer 116, the spacer layers 108 and the portions of the contact etch stop layer 110 adjacent to the spacer layers 108. The gate dielectric layer 114 may be made of high-k materials, such as metal oxides, metal nitrides, or other applicable dielectric materials.

In some embodiments, the gate electrode layer 116 is made of a conductive material, such as aluminum, copper, tungsten, titanium, tantalum, or another applicable material. Each of the gate structures 118a, 118b, 118c, and 118d may further include a work function metal layer (not shown) between the gate dielectric layer 114 and the gate electrode layer 116, so that the gate structures 118a, 118b, 118c, and 118d have the proper work function values. An exemplary p-type work function metal layer may be made of TiN, TaN, Ru, Mo, Al, WN, or a combination thereof. An exemplary n-type work function metal layer may be made of Ti, Ag, TaAl, TaAlC, TiAlN, TaC, TaCN, TaSiN, Mn, Zr, or a combination thereof.

Afterwards, the gate structures 118a, 118b, 118c, and 118d are recessed by etching, so as to form recesses 123, as shown in FIGS. 1C and 2C in accordance with some embodiments. During the etching, the top of the portions of the contact etch stop layer 110 adjacent to the spacer layers 108 are also recessed. In some embodiments, each of the gate electrode layers 116 is further recessed by etching after the upper sidewalls of the insulating layer 120 are exposed by the recesses 123, so that the recesses 123 are extended to form a T-shaped profile, as shown in FIG. 2C. Therefore, the upper surface of the gate spacers 108, the portions of the contact etch stop layer 110 adjacent to the gate spacers 108, and the upper surface of the gate dielectric layers 114 are higher than the upper surface of the corresponding gate electrode layers 116, in accordance with some embodiments.

Afterwards, a conductive capping layer 125 is formed to cover each of the recessed gate electrode layers 116, as shown in FIGS. 1C and 2C in accordance with some embodiments. The conductive capping layers 125 and the underlying gate electrode layer 116 form gate stacks of the gate structures 118a, 118b, 118c, and 118d. In some embodiments, the upper surface of each gate spacer 108 is higher than the upper surface of each gate stack, as shown in FIGS. 1C and 2C. In some embodiments, the conductive capping layers 125 serve as etch stop layers or protective layers for protecting the gate electrode layers 116 from damage or loss during subsequent processing, and are made of a metal material, such as tungsten.

After the conductive capping layers 125 are formed, insulating caps 130a, 130b, 130c, and 130d are respectively formed in the recesses 123 (not shown and as indicated in FIGS. 1C and 2C) to cover the corresponding conductive capping layer 125 and the corresponding gate electrode layers 116, as shown in FIGS. 1D and 2D in accordance with some embodiments. The insulating caps 130a, 130b, 130c, and 130d are formed to cover the upper surfaces of the gate structures 118a, 118b, 118c, and 118d. In some embodiments, an insulating layer (not shown) used for formation of the insulating caps 130a, 130b, 130c, and 130d is formed over the structure shown in FIGS. 1C and 2C and fills the recesses 123.

For example, the insulating layer is made of a different material than the material of the insulating layer 120 and includes high-k materials, such as metal oxides including $ZrO_2$, $HfO_2$, or SiN. The insulating layer may be formed by performing a chemical vapor deposition (CVD) process, a plasma enhanced CVD (PECVD) process, low-pressure CVD (LPCVD) process, an atomic layer deposition (ALD) process, or another applicable process.

Afterwards, a polishing process, such as a chemical mechanical polishing (CMP) process, is performed to remove the excess insulating layer above the insulating layer 120 in accordance with some embodiments. After the polishing process, the remaining insulating layer forms insulating caps 130a, 130b, 130c, and 130d, as shown in FIGS. 1D and 2D.

In some embodiments, the upper surfaces of the insulating caps 130a, 130b, 130c, and 130d are substantially level with the upper surface of the insulating layer 120. The insulating caps 130a, 130b, 130c, and 130d serve as etch stop layers and protect the gate structures 118a, 118b, 118c, and 118d in the subsequent manufacturing processes (e.g., etching processes).

After the insulating caps 130a, 130b, 130c, and 130d are formed, a patterned insulating layer 136 and a patterned masking layer 138 are successively formed over the structure shown in FIG. 2E, in accordance with some embodiments. In some embodiments, the insulating layer 136 is patterned using the patterned masking layer 138 as an etch mask. In some embodiments, the method and the material used for forming the insulating layer 120 are used for forming the insulating layer 136.

Afterwards, the masking layer 138 is formed over the insulating layer 136. In some embodiments, the masking layer 138 includes a tri-layer resist structure including a bottom layer, a middle layer, and a top layer. In order to simplify the diagram, only a flat layer (i.e., the masking layer 138) is depicted.

For example, the bottom layer is a first layer of the tri-layer resist structure. The bottom layer may contain a material that is patternable and/or have an anti-reflection property, such as a bottom anti-reflective coating (BARC) layer or a nitrogen-free anti-reflective coating (NFARC) layer. In some embodiments, the bottom layer is formed by a spin-on coating process, a chemical vapor deposition (CVD) process, a physical vapor deposition (PVD) process, or another suitable deposition process. The middle layer is formed over the bottom layer and is a second layer of the tri-layer resist structure. The middle layer (which is also referred to as a hard mask layer) provides hard mask properties for the photolithography process. In addition, the middle layer is designed to provide etching selectivity from the bottom layer and the top layer. In some embodiments, the middle layer is made of silicon nitride, silicon oxynitride or silicon oxide and is formed by a spin-on coating process, a chemical vapor deposition (CVD) process, a physical vapor deposition (PVD) process, or another suitable deposition process.

The top layer is formed over the middle layer and is a third layer of the tri-layer resist structure. The top layer may be positive photoresist or negative photoresist. In some other embodiments, the tri-layer resist structure includes oxide-nitride-oxide (ONO) layers.

Afterwards, the masking layer 138 is patterned to form an opening to expose a source/drain contact region (not shown) of the underlying insulating layer 136, in accordance with some embodiments.

An etching process is performed on the exposed insulating layer 136, the underlying insulating layer 120, and the portions of the contact etch stop layer 110 covering the source/drain features 112, so as to form a self-aligned opening 140, as shown in FIG. 2E in accordance with some embodiments. When the self-aligned opening 140 is formed, the insulating caps 130b, 130c, and 130d are used as etch masks for protecting the gate structures 118b, 118c, and 118d. As a result, the self-aligned opening 140 is formed through the insulating layers 136 and 120 to expose the upper surfaces of some source/drain features 112, as shown in FIG. 2E.

In some embodiments, the self-aligned opening 140 is formed by etching the insulating layers 136 and 120 between the insulating caps 130b, 130c, and 130d. During the etching of the insulating layers 136 and 120, and the contact etch stop layer 110, the etch masks (i.e., insulating caps 130b, 130c, and 130d) define some source/drain contact regions between the gate structures. For example, the source/drain contact regions are between gate structures 118b, 118c, and 118*d*. Although some portions of the insulating caps 130*a*, 130*b*, 130*c*, and 130*d* may also be removed during the etching for formation of the self-aligned opening 140, the gate structures 118*b*, 118*c*, and 118*d* are still protected by the insulating caps 130*b*, 130*c*, and 130*d*.

After the self-aligned opening 140 is formed, an ion implantation process may be performed to dope impurity (e.g., p-type impurities) into the exposed source/drain features 112. Afterwards, a salicide process may be performed to form salicide layers (not shown) over the exposed the upper surfaces of the source/drain features 112. The salicide layers may be formed by forming a metal layer over the upper surfaces of the source/drain features 112. Afterwards, an annealing process is performed on the metal layer so the metal layer reacts with the source/drain features 112. Afterwards, the unreacted metal layer is removed to form the salicide layers. Examples for forming the metal layer may include Ti, Co, Ni, NiCo, Pt, Ni(Pt), Ir, Pt(Ir), Er, Yb, Pd, Rh, Nb, TiSiN, and the like.

Afterwards, the masking layer 138 is removed and gate spacers 141 are formed in the lower portion of the self-aligned opening 140, as shown in FIG. 2F in accordance with some embodiments. In some embodiments, an insulating layer (not shown), such as silicon nitride is conformally formed over the structure shown in FIG. 2F without the masking layer 138. Afterwards, an etching process is performed on the insulating layer. The remaining insulating layers form gate spacers 141 adjacent to the portions of the contact etch stop layer 110 exposed from the lower portion of the self-aligned opening 140.

Source/drain contact structures 142 fill the self-aligned opening 140 between the gate structures 118*b*, 118*c*, and 118*d* and between the insulating caps 130*b*, 130*c*, and 130*d*, as shown in FIG. 2G in accordance with some embodiments. In some embodiments, the source/drain conductive structure 142 is made of Co, Ru, W, Cu, or the like. A conductive material (not shown) may be formed over the insulating layer 136 and fill the self-aligned opening 140 by a chemical vapor deposition (CVD) process, a physical vapor deposition, (PVD) process, an atomic layer deposition (ALD) process, an electroless deposition (ELD) process, an electrochemical plating (ECP) process, or another applicable process.

Afterwards, a polishing process is performed to remove the excess conductive material and the insulating layer 136 above the insulating caps 130*a*, 130*b*, 130*c*, and 130*d*, in accordance with some embodiments. In some embodiments, such a polishing process is performed on the conductive material, the insulating layer 136 and portions of the insulating caps 130*a*, 130*b*, 130*c*, and 130*d* until the insulating caps 130*a*, 130*b*, 130*c*, and 130*d* are exposed and planarized. In some embodiments, the polishing process includes a chemical mechanical polishing (CMP) process.

After the polishing process, the remaining conductive material forms the source/drain contact structures 142 between and adjacent to the gate structures 118*b* and 118*c*, and between and adjacent to the gate structures 118*d* and 118*c*, as shown in FIG. 2G. Those source/drain contact structures 142 are electrically connected to the corresponding source/drain features 112, and separated from the gate stacks by the gate spacers 108 that are formed over opposing sidewalls of the gate stacks. Moreover, the upper surface of the source/drain contact structures 142 is substantially level with the upper surface of the planarized insulating caps 130*a*, 130*b*, 130*c*, and 130*d*.

Afterwards, each of the source/drain contact structures 142 is recessed, so that each of the source/drain contact structures 142 has an upper surface that is lower than the bottom surface of the planarized insulating caps 130*a*, 130*b*, 130*c*, and 130*d*, as shown in FIG. 2H in accordance with some embodiments. After the source/drain contact structures 142 are recessed, the conductive capping layers 125 have an upper surface that is higher than the upper surface of the source/drain contact structures 142. Moreover, each of the source/drain contact structures 142 successively covered by an optional conductive capping layer 146 and a masking layer 148, as shown in FIG. 2H in accordance with some embodiments.

In some embodiments, the conductive capping layer 146 is in contact with the corresponding source/drain contact structure 142, and includes a material that is the same or similar to that of the conductive capping layer 125. For example, the conductive capping layer 146 may be made of metal, such as tungsten, and formed by a selective deposition process. In some embodiments, the conductive capping layers 125 have an upper surface that is higher than the upper surface of the conductive capping layer 146.

In some embodiments, the masking layer 148 is made of an insulating material that is the same as or different from the insulating layer 120. For example, the masking layer 148 may be made of silicon oxide or silicon nitride and formed by a method that is the same as or similar to the insulating layer 120. After the masking layer 148 is formed, the upper surface of the masking layer 148 is substantially level with the upper surface of the planarized insulating caps 130*a*, 130*b*, 130*c*, and 130*d*, as shown in FIG. 2H in accordance with some embodiments.

After the masking layers 148 are formed, patterned insulating layers 150 and 152 are successively formed over the structure shown in FIG. 2H, as shown in FIG. 2I in accordance with some embodiments. More specifically, insulating layers 150 and 152 are successively formed over the insulating layer 120 and the planarized insulating caps 130*a*, 130*b*, 130*c*, and 130*d*. In some embodiments, the method and the material used for forming the masking layer 148 are used for forming the insulating layer 150. Moreover, the method and the material used for forming the insulating layer 120 or 136 are used for forming the insulating layer 152.

Afterwards, the insulating layer 152 is patterned to form openings 156 and 158 to expose the insulating layer 150, in accordance with some embodiments. Such a patterning process is a dry etching process using the insulating layer 150 as an etch stop layer, in accordance with some embodiments. Afterwards, in some embodiments, the exposed insulating layer 150 is removed by an etching process, such as a dry etching process, to expose the insulating cap 130*a*, the masking layers 148, and top corners of the insulating caps 130*b*, 130*c*, and 130*d*.

Afterwards, in some embodiments, the exposed insulating cap 130*a* and the exposed masking layers 148 are successively removed using the conductive capping layers 125 and 146 as an etch stop layer, so as to extend the openings 156 and 158 to the conductive capping layers 125 and 146, respectively. The opening 156 may be referred to as a self-aligned gate via opening, and the opening 158 may be referred to as a self-aligned source/drain via opening. During the removal of the masking layers 148, the exposed top corners of the insulating caps 130*b*, 130*c*, and 130*d* may also be etched, so that those top corners are rounded.

After the openings 156 and 158 are formed, a conductive material 160 is formed over the insulating layer 152 and fills the openings 156 and 158, as shown in FIG. 2J in accordance with some embodiments. The conductive material 160 may be made of metal, such as W or Ru and formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

Afterwards, a polishing process is performed to remove the excess conductive material 160 and the underlying layers until the insulating caps 130b, 130c, and 130d, the gate spacers 108, the portions of the contact etch stop layer 110 adjacent to the gate spacers 108, and the insulating layer 120 are exposed and planarized, as shown in FIG. 2K in accordance with some embodiments. In some embodiments, the polishing process includes a chemical mechanical polishing (CMP) process.

Moreover, the insulating caps 130b, 130c, and 130d, the gate spacers 108, the portions of the contact etch stop layer 110 adjacent to the gate spacers 108, and the insulating layer 120 have upper surfaces that are substantially level with the upper surface of the remaining conductive material 160.

After the polishing process, the remaining conductive material 160 forms a conductive via structures 162 and 164, as shown in FIG. 2K in accordance with some embodiments. In some embodiments, the via structure 162 is in direct contact to the conductive capping layer 125 to electrically connect the gate electrode layer 116 of the gate structure 118a. Therefore, the via structure 162 is referred to as a gate via structure. Each of the via conductive via structures 164 is in direct contact to the corresponding conductive capping layer 146 to electrically connect the corresponding source/drain contact structure 142. Therefore, the via structure 164 is referred to as a source/drain via structure.

After the polishing process, the remaining conductive material 160 forms the gate via structure 162 and source/drain via structures 164 between and adjacent to the gate structures 118b, 118c, and 118d, as shown in FIG. 2K in accordance with some embodiments. The gate via structure 162 is in direct contact with and electrically connected to the gate stack of the gate structure 118a. Those source/drain via structures 164 are in direct contact with electrically connected to the corresponding conductive capping layer 146 on the corresponding source/drain features 112.

Afterwards, the insulating capping layers 130b, 130c, and 130d are removed from the gate structures 118b, 118c, and 118d to form recesses 167 with a depth D above the gate structures 118b, 118c, and 118d, as shown in FIG. 2L in accordance with some embodiments. In some embodiments, those recesses 167 are formed by an etching process, such as a dry or wet etching process.

After those recesses 167 are formed, a sacrificial layer 172 is formed in each of the recesses 167, as shown in FIGS. 2M to 2N in accordance with some embodiments. As shown in FIG. 2M, a heat depolymerized material layer 170 is formed over the structure shown in FIG. 2L and fills in the recesses 167. The heat depolymerized material layer 170 includes a polymer which is formed by polymerizing at least two different reactants (e.g., monomers). Such a polymer can be depolymerized by heat. Sometimes such a heat depolymerized material layer 170 is also referred to as an ashless carbon (ALC) layer. The heat depolymerized material layer 170 may be formed by a plasma deposition process, such as a chemical vapor deposition (CVD) process, a physical vapor deposition, (PVD) process, an atomic layer deposition (ALD) process, or another applicable process.

Afterwards, the heat depolymerized material layer 170 is etched back to expose a portion of each recess 167, as shown in FIG. 2N in accordance with some embodiments. In some embodiments, the remaining heat depolymerized material layer 170 forms the sacrificial layers 172 in the recesses 167, respectively. Each of the sacrificial layers 172 has an upper surface that is lower than the top of the corresponding recess 167. Each of the sacrificial layers 172 has a thickness that is in a range from about 1 nm to about D−1 nm (where "D" is the depth of the recess 167, as shown in FIG. 2L). In some embodiments, the heat depolymerized material layer 170 is etched back by an annealing process using $O_2$, $N_2$, NH, HF, $F_2$, or a combination thereof as a process gas. The annealing process may be performed at a temperature in a range from about 200° C. to about 500° C. for a period in a range from about 30 seconds to 5 minutes.

In some other embodiments, the heat depolymerized material layer 170 is etched back by a dry etching process using $CF_4$, $CHF_3$, $O_2$, $O_3$, or a combination thereof as a process gas. Alternatively, the heat depolymerized material layer 170 is etched back by an ashing process using $O_2$, $O_3$, or a combination thereof as a process gas.

After the recesses 167 and the sacrificial layers 172 are formed, air gaps 178 and insulating cap structures 184 respectively covering the air gaps 178 are formed, as shown in FIGS. 2O to 2R in accordance with some embodiments. More specifically, a capping layer 176 is conformally formed to cover the structure shown in FIG. 2N to cover the insulating layer 120, the via structures 162 and 164, and the sacrificial layers 172 in the recesses 167, as shown in FIG. 2O in accordance with some embodiments. The capping layer 176 extends on and makes direct contact with the sidewalls and the bottom of the recesses 167. In some embodiments, the capping layer 176 is used for formation of the insulating cap structures 184 (as indicated in FIG. 2R) in the recesses 167. In some embodiments, the capping layer 176 has a thickness that is in a range from about 0.5 nm to about 5 nm. Moreover, the capping layer 176 is made of a low-k material, such as $SiO_2$, SiOC, SiN, or SiCN. Therefore, the subsequently formed insulating cap structures (which include the capping layer 176) are in the recesses 167. The capping layer 176 may be formed by performing a low temperature deposition process, such as a chemical vapor deposition (CVD) process, or another applicable process. For example, the low temperature deposition process is performed at a temperature that is in a range from about 200° C. to about 400° C.

After the formation of the capping layer 176, the sacrificial layers 172 in the recesses 167 are removed to form air gaps 178, so that the conductive capping layer 125 is between the corresponding air gap 178 and the corresponding electrode layer 116, as shown in FIG. 2P in accordance with some embodiments. Each of the air gaps 178 separates the corresponding gate stack from the insulating capping layer 176. In some embodiments, the sacrificial layers 172 in the recesses 167 are removed by an annealing process. For example, the annealing process may be performed using $O_2$, $N_2$, NH, HF, $F_2$, or a combination thereof as a process gas. The annealing process may be performed at a temperature in a range from about 250° C. to about 500° C. for a period in a range from about 20 seconds to 5 minutes.

Afterwards, a capping layer 180 is formed to cover the capping layer 176 and fills the remaining recesses 167, as shown in FIG. 2Q in accordance with some embodiments. In some embodiments, the capping layer 180 is also used for formation of the insulating cap structures in the recesses 167. The capping layer 180 is made of a low-k material, such as $SiO_2$, SiOC, SiN, or SiCN. Therefore, the subsequently formed insulating cap structures (which include the capping layer 180) in the recesses 167. The capping layer 180 may be formed by performing a high temperature deposition process, such as a chemical vapor deposition (CVD) process, or another applicable process. For example, the high temperature deposition process is performed at a temperature that is in a range from about 250° C. to about 400° C.

Afterwards, a polishing process is performed to remove the excess capping layers 180 and 176 above the insulating layer 120, as shown in FIG. 2R in accordance with some embodiments. In some embodiments, such a polishing process is successively performed on the capping layers 180 and 176 until the upper surface of the insulating layer 120 is exposed. In some embodiments, the polishing process includes a chemical mechanical polishing (CMP) process.

After the polishing process, the remaining capping layers 180 and 176 form insulating cap structures 184, as shown in FIG. 2R. In some embodiments, the upper surfaces of the insulating cap structures 184 are substantially level with the upper surfaces of the insulating layer 120, the via structures 162 and 164. In some embodiments, in the insulating cap structure 184, the remaining capping layer 176 covers the bottom and opposite sidewalls of the remaining capping layer 180. In other words, in each of the insulating cap structures 184, the remaining capping layer 176 has a U-shaped profile, so that the opposite sidewalls and the bottom of the remaining capping layer 180 is covered by the capping layers 170. Moreover, each of the formed air gaps 178 is surrounded by the corresponding gate spacers 108, the corresponding gate stack of the gate structure 118b, 118c, or 118d, and the corresponding insulating cap structure 184.

Although the semiconductor device structure formed by the methods shown in FIGS. 2A to 2R includes air gaps 178 that are formed by removing the sacrificial layers 172 before the insulating capping layer 180 is formed, embodiments of the disclosure are not limited thereto. Many variations and/or modifications can be made to embodiments of the disclosure. For example, the air gaps 178 may be formed by removing the sacrificial layers 172 after the insulating capping layer 180 is formed.

Figure 3A:
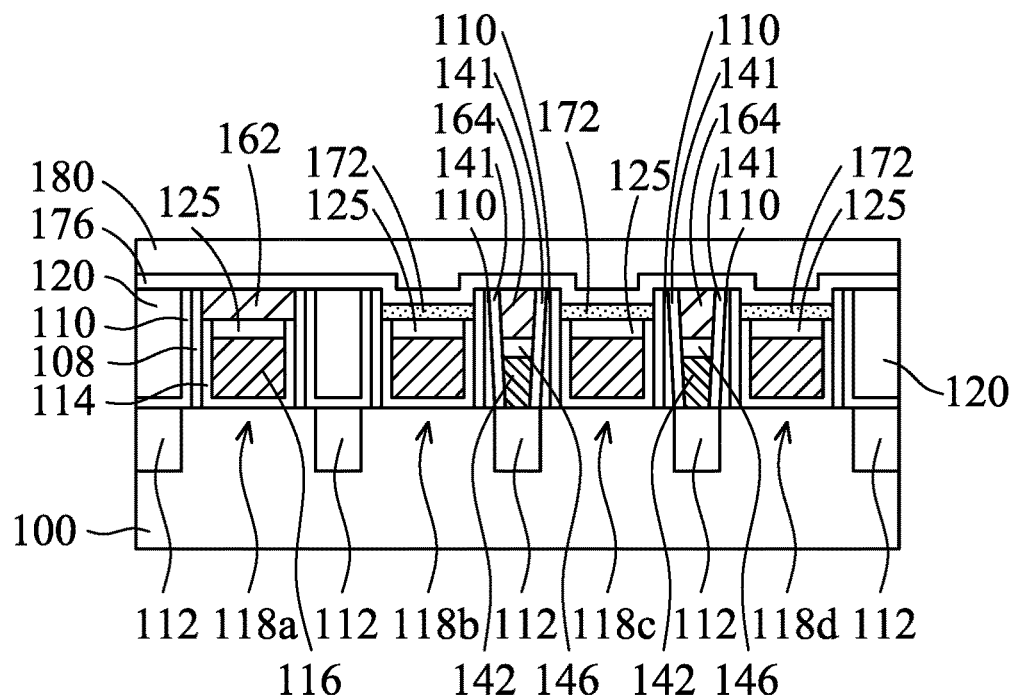
FIGS. 3A to 3C illustrate cross-sectional representations of various stages of manufacturing a semiconductor device structure in accordance with some embodiments.
Figure 3B:
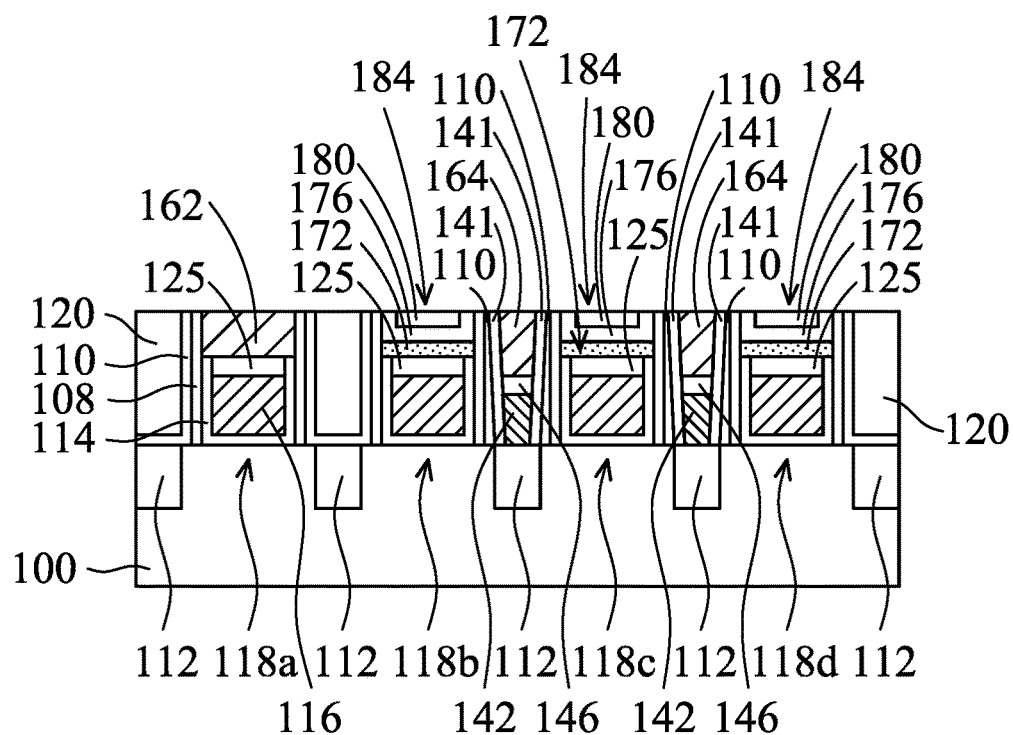
Figure 3C:
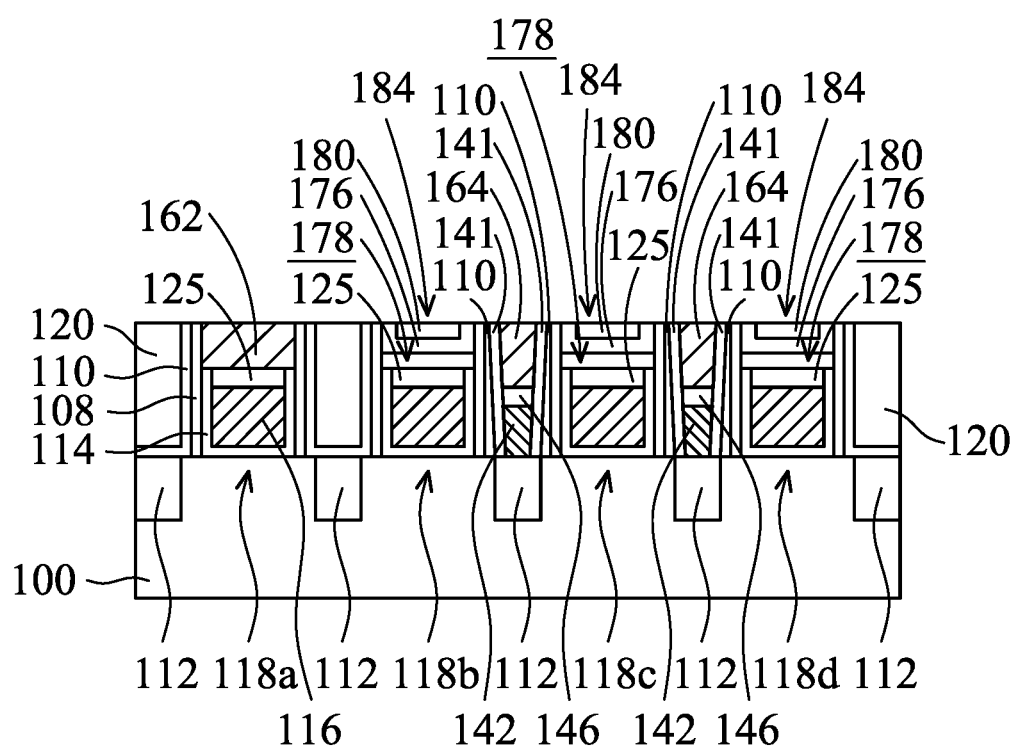

FIGS. 3A to 3C illustrate cross-sectional representations of various stages of manufacturing a semiconductor device structure in accordance with some embodiments. A structure shown in FIG. 2O is provided, and a capping layer 180 is formed to cover the capping layer 176 and fills the remaining recesses 167, as shown in FIG. 3A in accordance with some embodiments.

Afterwards, a polishing process, such as a chemical mechanical polishing (CMP) process, is performed to remove the excess capping layers 180 and 176 above the insulating layer 120, as shown in FIG. 3B in accordance with some embodiments. In some embodiments, such a polishing process is successively performed on the capping layers 180 and 176 until the upper surface of the insulating layer 120 is exposed. After the polishing process, the remaining capping layers 180 and 176 form insulating cap structures 184 (not shown and indicated in FIG. 3C).

After the formation of the capping layer 180, the sacrificial layers 172 in the recesses 167 are removed to form air gaps 178, so that the conductive capping layer 125 is between the corresponding air gap 178 and the corresponding electrode layer 116, as shown in FIG. 3C in accordance with some embodiments. Each of the air gaps 178 separates the corresponding gate stack from the insulating capping layer 176.

Embodiments of semiconductor device structures and methods for forming the same are provided. The formation of the semiconductor device structure includes forming a gate stack and a source/drain contact structure over a semiconductor substrate and adjacent to each other. Afterwards, an insulating cap structure is formed over the gate stack and separated from the upper surface of the gate stack by an air gap. The air gap has a lower dielectric constant (k) than that of the other dielectric materials, so that the parasitic capacitance between the source/drain contact structure and the gate stack and between the interconnect structure and the gate stack can be reduced. As a result, the device performance can be effectively increased.

In some embodiments, a semiconductor device structure is provided. The semiconductor device structure includes a source/drain contact structure formed over a semiconductor substrate, and a first gate stack formed over the semiconductor substrate and adjacent to the source/drain contact structure. The semiconductor device structure also includes an insulating cap structure formed over and separated from an upper surface of the first gate stack. In addition, the semiconductor device structure includes first gate spacers formed over opposing sidewalls of the first gate stack to separate the first gate stack from the source/drain contact structure. The first gate spacers extend over opposing sidewalls of the insulating cap structure, so as to form an air gap surrounded by the first gate spacer, the first gate stack, and the insulating cap structure.

In some embodiments, a semiconductor device structure is provided. The semiconductor device structure includes a fin structure over a semiconductor substrate. The semiconductor device structure also includes a first gate structure and a second gate structure adjacent to each other and across the fin structure. Each of the first gate structure and the second gate structure includes a gate electrode layer, gate spacers formed over opposing sidewalls of the gate electrode layer, and a gate dielectric layer between the gate electrode layer and the semiconductor substrate and between the gate electrode layer and the gate spacers. In addition, the semiconductor device structure includes an insulating cap structure formed over and separated from the upper surface of the electrode layer of the first gate structure. The gate spacers of the first gate structure extend over opposing sidewalls of the insulating cap structure, so as to form an air gap between the electrode layer of the first gate structure and the insulating cap structure.

In some embodiments, a method for forming a semiconductor device structure is provided. The method includes forming a gate structure over a semiconductor substrate and across a fin structure of the semiconductor substrate. The gate structure includes a gate electrode layer and gate spacers formed over opposing sidewalls of the gate electrode layer. The method also includes covering the gate electrode layer with an insulating cap and forming a source/drain contact structure over the semiconductor substrate and adjacent to the gate structure. The source/drain contact structure has an upper surface that is lower than a bottom surface of the insulating cap. The method further includes forming a source/drain via structure over and electrically connected to the source/drain contact structure. In addition, the method includes removing the insulating cap to form a recess and forming a sacrificial layer in the recess. The method also includes forming a first insulating capping layer in the recess to cover the sacrificial layer and forming a second insulating capping layer in the second recess to cover the first insulating capping layer. The method further includes removing the sacrificial layer in the recess to form an air gap separating the gate electrode layer from the first insulating capping layer.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a source/drain contact structure formed over a semiconductor substrate;
   a first gate stack formed over the semiconductor substrate and adjacent to the source/drain contact structure;
   an insulating cap structure formed over and separated from an upper surface of the first gate stack; and
   first gate spacers along opposing sidewalls of the first gate stack to separate the first gate stack from the source/drain contact structure, wherein the first gate spacers extend along opposing sidewalls of the insulating cap structure, so as to form an air gap surrounded by the first gate spacers, the first gate stack, and the insulating cap structure.

2. The semiconductor device structure as claimed in claim 1, wherein the insulating cap structure comprises:
   a first capping layer; and
   a second capping layer having a bottom and opposite sidewalls covered by the first capping layer,
   wherein the first capping layer and the second capping layer comprise a low-k material.

3. The semiconductor device structure as claimed in claim 1, further comprising a via structure formed over and electrically connected to the source/drain contact structure.

4. The semiconductor device structure as claimed in claim 3, further comprising a conductive capping layer in contact with the source/drain contact structure and the via structure.

5. The semiconductor device structure as claimed in claim 3, further comprising second gate spacers extending along opposing sidewalls of the source/drain contact structure and opposing sidewalls of the via structure.

6. The semiconductor device structure as claimed in claim 1, wherein the first gate stack comprises:
   a gate electrode layer; and
   a conductive capping layer between the gate electrode layer and the air gap,
   wherein the conductive capping layer has an upper surface that is higher than an upper surface of the source/drain contact structure.

7. The semiconductor device structure as claimed in claim 1, further comprising:
   a second gate stack formed over the semiconductor substrate;
   a via structure formed over and electrically connected to the second gate stack; and
   second gate spacers along opposing sidewalls of the second gate stack, wherein an insulating layer is formed between one of the first gate spacers and one of the second gate spacers.

8. The semiconductor device structure as claimed in claim 7, wherein the second gate stack comprises:
   a gate electrode layer; and
   a conductive capping layer in contact with the gate electrode layer and the via structure.

9. A semiconductor device structure, comprising:
   a fin structure over a semiconductor substrate;
   a first gate structure and a second gate structure adjacent to each other and across the fin structure, wherein each of the first gate structure and the second gate structure comprises:
      a gate electrode layer;
      gate spacers along opposing sidewalls of the gate electrode layer; and
      a gate dielectric layer between the gate electrode layer and the semiconductor substrate and between the gate electrode layer and the gate spacers; and
   an insulating cap structure formed over and separated from an upper surface of the gate electrode layer of the first gate structure, wherein the gate spacers of the first gate structure extend along opposing sidewalls of the insulating cap structure, so as to form an air gap between the gate electrode layer of the first gate structure and the insulating cap structure.

10. The semiconductor device structure as claimed in claim 9, further comprising:
    a source/drain feature formed in the fin structure and adjacent to the first gate structure; and
    a source/drain contact structure formed over and electrically connected to the source/drain feature.

11. The semiconductor device structure as claimed in claim 10, further comprising:
    a first via structure formed over and electrically connected to the source/drain contact structure; and
    a second via structure formed over and electrically connected to the gate electrode layer of the second gate structure.

12. The semiconductor device structure as claimed in claim 11, further comprising:
    a first conductive capping layer formed between the first via structure and the source/drain contact structure;
    a second conductive capping layer formed between the second via structure and the gate electrode layer of the second gate structure; and
    a third conductive capping layer formed between the air gap and the gate electrode layer of the first gate structure.

13. The semiconductor device structure as claimed in claim 12, wherein the second conductive capping layer and the third capping layer have an upper surface that is higher than an upper surface of the first conductive capping layer.

14. The semiconductor device structure as claimed in claim 9, wherein the insulating cap structure comprises:
    a first capping layer; and
    a second capping layer covering a bottom and opposite sidewalls of the first capping layer.

15. The semiconductor device structure as claimed in claim 14, wherein the first capping layer and the second capping layer comprise a low-k material.

16. A method for forming a semiconductor device structure, comprising:
- forming a gate structure over a semiconductor substrate and across a fin structure of the semiconductor substrate, wherein the gate structure comprises:
  - a gate electrode layer; and
  - gate spacers along opposing sidewalls of the gate electrode layer;
- covering the gate electrode layer with an insulating cap;
- forming a source/drain contact structure over the semiconductor substrate and adjacent to the gate structure, wherein the source/drain contact structure has an upper surface that is lower than a bottom surface of the insulating cap;
- forming a source/drain via structure over and electrically connected to the source/drain contact structure;
- removing the insulating cap to form a recess;
- forming a sacrificial layer in the recess;
- forming a first insulating capping layer in the recess to cover the sacrificial layer;
- forming a second insulating capping layer in the recess to cover the first insulating capping layer; and
- removing the sacrificial layer in the recess to form an air gap separating the gate electrode layer from the first insulating capping layer.

17. The method as claimed in claim 16, wherein the formation of the sacrificial layer comprises:
- depositing a heat depolymerized material layer over the source/drain via structure and in the recess; and
- etching back the heat depolymerized material layer by an annealing, dry etching, or ashing process, so as to use the remaining heat depolymerized material layer as the sacrificial layer, wherein the sacrificial layer has an upper surface that is lower than a top of the recess.

18. The method as claimed in claim 17, wherein the sacrificial layer is removed by an annealing process before the second insulating capping layer is formed.

19. The method as claimed in claim 17, wherein the sacrificial layer is removed by an annealing process after the second insulating capping layer is formed.

20. The method as claimed in claim 16, wherein the insulating cap comprises a high-k material and the first insulating capping layer and the second insulating capping layer comprise a low-k material.

* * * * *

UNITED STATES PATENT AND TRADEMARK OFFICE
CERTIFICATE OF CORRECTION

PATENT NO. : 11,282,920 B2  
APPLICATION NO. : 16/572192  
DATED : March 22, 2022  
INVENTOR(S) : Tien-Lu Lin et al.

Page 1 of 1

It is certified that error appears in the above-identified patent and that said Letters Patent is hereby corrected as shown below:

On the Title Page

Item (72), Inventors:  
Change the 5th Inventor from:  
"Chih-Hao Chang, Hsinchu (TW)"  
To:  
--Chia-Hao Chang, Hsinchu (TW)--

Signed and Sealed this  
Twenty-seventh Day of September, 2022

Katherine Kelly Vidal  
*Director of the United States Patent and Trademark Office*